(12) United States Patent
Kim (10) Patent No.: US 7,952,414 B2
(45) Date of Patent: May 31, 2011

(54) PHASE CLOCK GENERATOR

(75) Inventor: Tae Gyu Kim, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 251 days.

(21) Appl. No.: 12/207,569

(22) Filed: Sep. 10, 2008

(65) Prior Publication Data

US 2009/0072878 A1 Mar. 19, 2009

(30) Foreign Application Priority Data

Sep. 14, 2007 (KR) .................. 10-2007-0093431

(51) Int. Cl.
*G06F 1/04* (2006.01)
(52) U.S. Cl. ........ 327/298; 327/149; 327/158; 327/161; 327/291
(58) Field of Classification Search ............. 327/149, 327/158, 161, 291, 293, 294, 298, 299
See application file for complete search history.

(56) References Cited

U.S. PATENT DOCUMENTS

| | | | | |
|---|---|---|---|---|
| 7,292,079 | B2 * | 11/2007 | Huang et al. ............. | 327/158 |
| 7,339,413 | B2 * | 3/2008 | Kim ........................ | 327/291 |
| 2007/0030041 | A1 * | 2/2007 | Huang et al. ............. | 327/158 |
| 2007/0063931 | A1 * | 3/2007 | Kim ........................ | 345/76 |

FOREIGN PATENT DOCUMENTS

| | | |
|---|---|---|
| KR | 10-2007-0032446 | 3/2007 |
| KR | 10-2007-0071141 | 7/2007 |

* cited by examiner

*Primary Examiner* — Lincoln Donovan
*Assistant Examiner* — Patrick O'Neill
(74) *Attorney, Agent, or Firm* — Saliwanchik, Lloyd & Eisenschenk (57) ABSTRACT

Disclosed is a phase clock generator. The phase clock generator can include transistors and a buffer. The transistors are connected between a power line and a grounding line and are provided in a form of a 4×N matrix to receive a plurality of phase-delayed signals through their gate terminals. Four transistors can form a unit column between the power line and the grounding line. From ground line to power line, the first two transistors of the unit column provide a pair of NMOS transistors, and the second two transistors provide a pair of PMOS transistors. The buffer is connected to a line, which is provided between the pair of the NMOS transistors and the pair of the PMOS transistors forming the unit column, to transmit a clock signal.

10 Claims, 11 Drawing Sheets

FIG. 11

PHASE CLOCK GENERATOR

CROSS-REFERENCE TO RELATED APPLICATION

The present application claims the benefit under 35 U.S.C. §119 of Korean Patent Application No. 10-2007-0093431, filed Sep. 14, 2007, which is hereby incorporated by reference in its entirety.

BACKGROUND

Recently, various narrow band and broad band communication systems have been developed to provide services, such as mobile communications, satellite communications, and broadcasting. Circuits constituting the communication systems, including a mixer, a balloon circuit, a modulator, and a demodulator, require a clock signal in order to process frequency signals having various channels.

Figure 1:
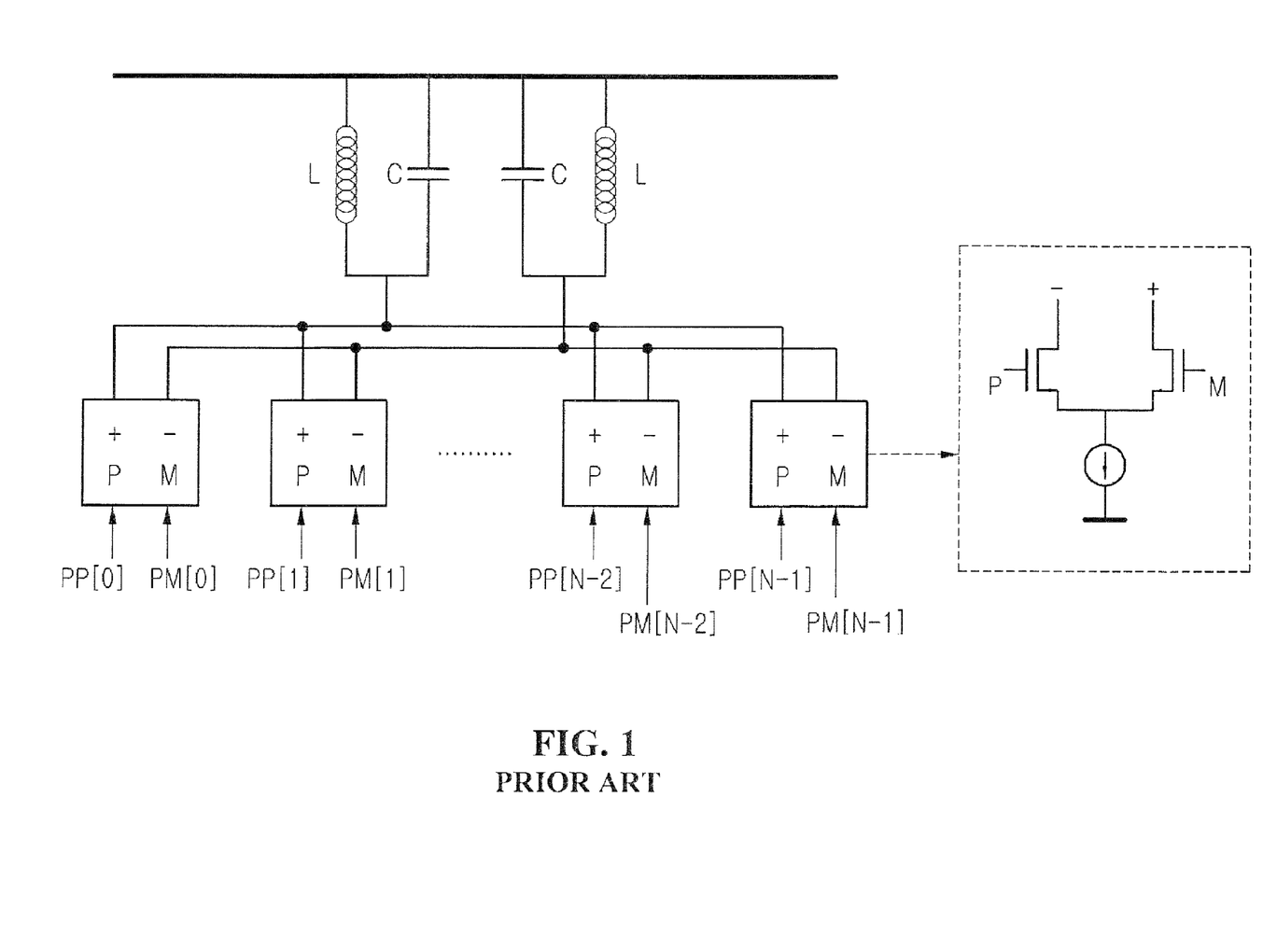
FIG. 1 is a circuit diagram schematically showing components of an edge combiner.
Figure 2:
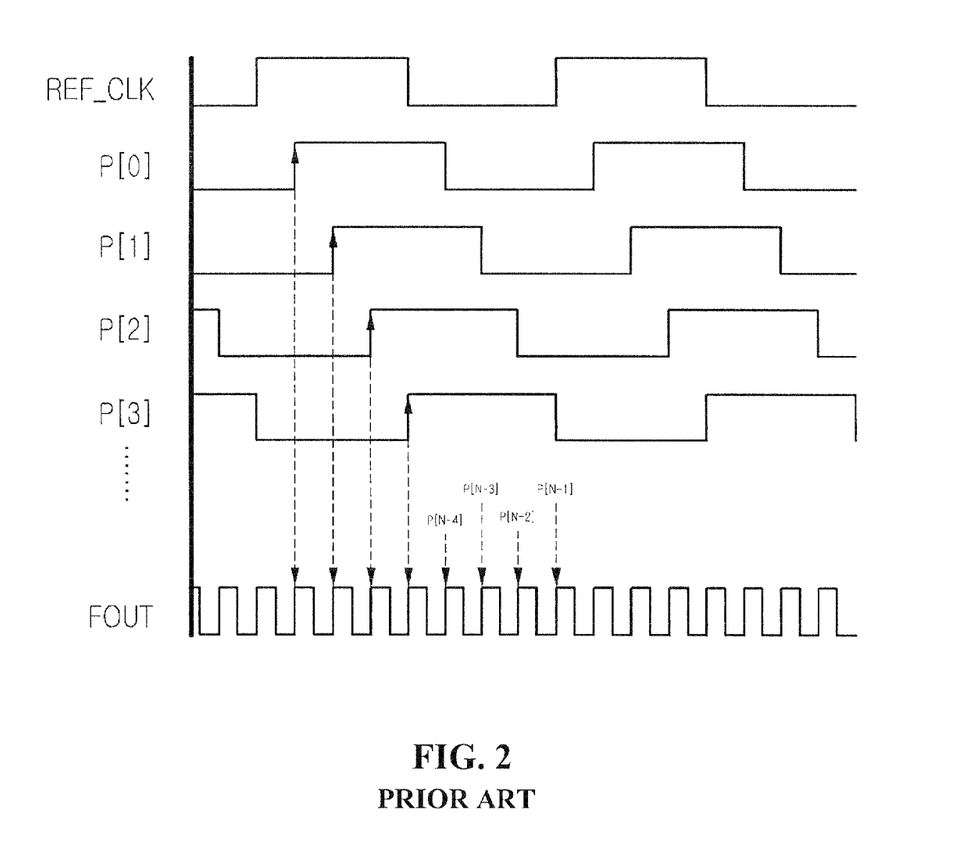
FIG. 2 is a timing chart showing measured output signals of the edge combiner of FIG. 1.

FIG. 1 is a circuit diagram schematically showing components of an edge combiner for a voltage controlled oscillator (VCO), and FIG. 2 is a timing chart showing measured output signals of the edge combiner of FIG. 1.

A VCO typically includes a delayed locked loop (DLL) and an edge combiner. The DLL generates various phase signals P[0], P[1], . . . , P[N−1], P[N] by phase-delaying a reference clock REF_CLK.

The edge combiner has a structure, in which two NMOS transistors forming a parallel circuit (indicated by the P M block) are provided in a multi-step. If a rising edge of a phase signal is detected, an LC tank circuit provided at the upper portion of the edge combiner generates resonance at the rising edge of the phase signal to oscillate a clock signal FOUT. The clock signal FOUT has a frequency corresponding to "reference clock×the number of a phase-delayed signal".

However, since an inductor L for the LC tank circuit is a distributed element having a large size and is not manufactured through a semiconductor fabricating process, it can be difficult to minimize a chip for the VCO. In addition, an oscillating operation may be easily affected by the matching between the inductor (L) and a capacitor (C) of the LC circuit. Accordingly, additional circuits must be employed. However, this may increase the power consumption of the device.

As an alternative approach to the edge combiner shown in FIG. 1, a frequency multiplier may be used.

Figure 3:
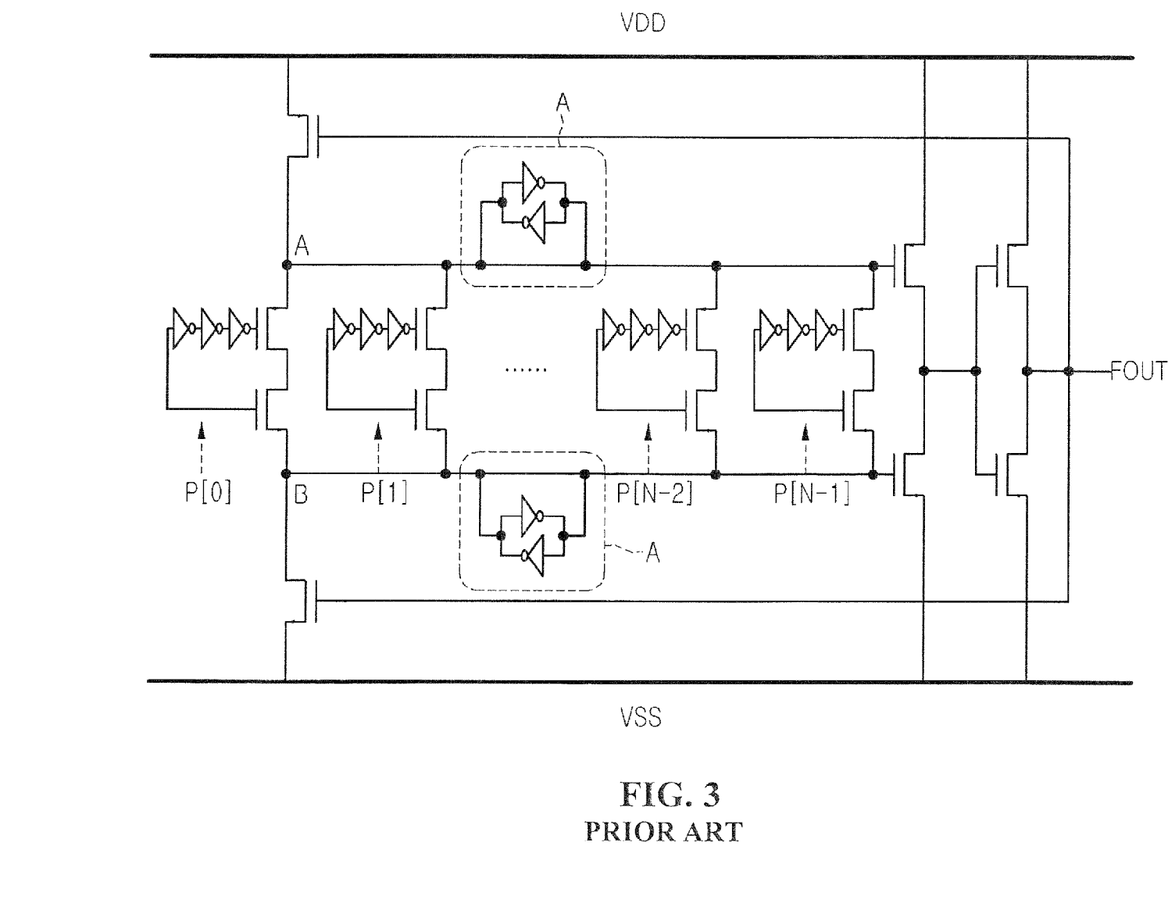
FIG. 3 is a circuit diagram schematically showing components of a frequency multiplier having an inverter structure.
Figure 4:
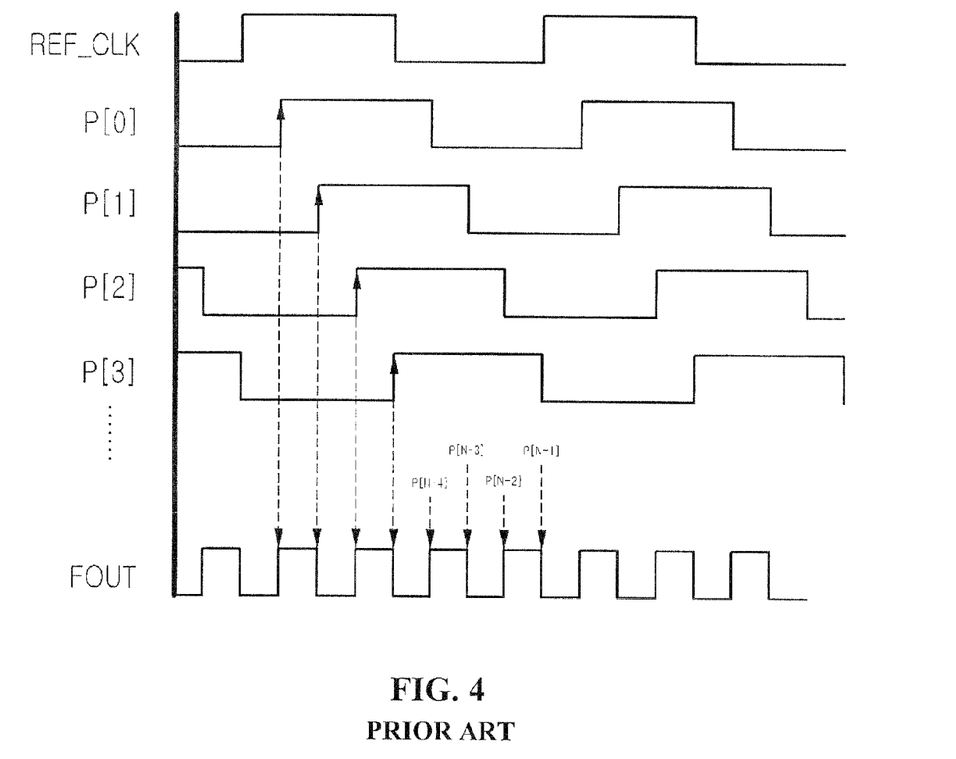
FIG. 4 is a timing chart showing measured output signals of the frequency amplifier having the inverter structure of FIG. 3.

FIG. 3 is a circuit diagram schematically showing components of a frequency multiplier having an inverter structure, and FIG. 4 is a timing chart showing measured output signals of the frequency amplifier having the inverter structure of FIG. 3.

The frequency multiplier detects a rising edge of a phase signal using phase-shifted signals P[0], P[1], . . . , P[n−1], P[n] generated from a DLL. The frequency multiplier has a multi-step structure of NMOS and PMOS transistors connected to each other in series, where the gates of the PMOS transistors are connected to a chain circuit of three inverters.

Accordingly, if the rising edge is detected, a local oscillating operation is performed by the chain circuit, and rising and falling periods of the clock signal are defined through the local oscillating operation. Therefore, a clock signal FOUT shown in FIG. 4 is generated. Coupled inverters (memory cell A) provided at upper and lower portions of the frequency multiplier stabilize the local oscillating operation.

However, the number of inverters connected to a transistor may be restricted. When an oscillation period is densely set, the rising edge may be erroneously detected.

In addition, since the edge of the phase delayed signals is exclusively used in this style of frequency multiplier, the memory cells A must be additionally provided at the upper and lower portions of the frequency multiplier to maintain a state. In addition, an edge detection time must be greatly increased due to the load of the memory cell A. This increased detection time may cause an erroneous operation of the inverter chain circuit.

One approach to solve the above problems has been to increase the number of the inverters constituting the chain circuit while maintaining an odd number of inverters. However, since the oscillation period of the inverter has a limitation, the high-frequency characteristic of a clock signal cannot be satisfied. Accordingly, the number of transistors must be increased in order to multiply the reference clock.

In this case, an amount of power consumption may be increased, the circuit may be complex, and the design of the semiconductor chip may be difficult.

Figure 5:
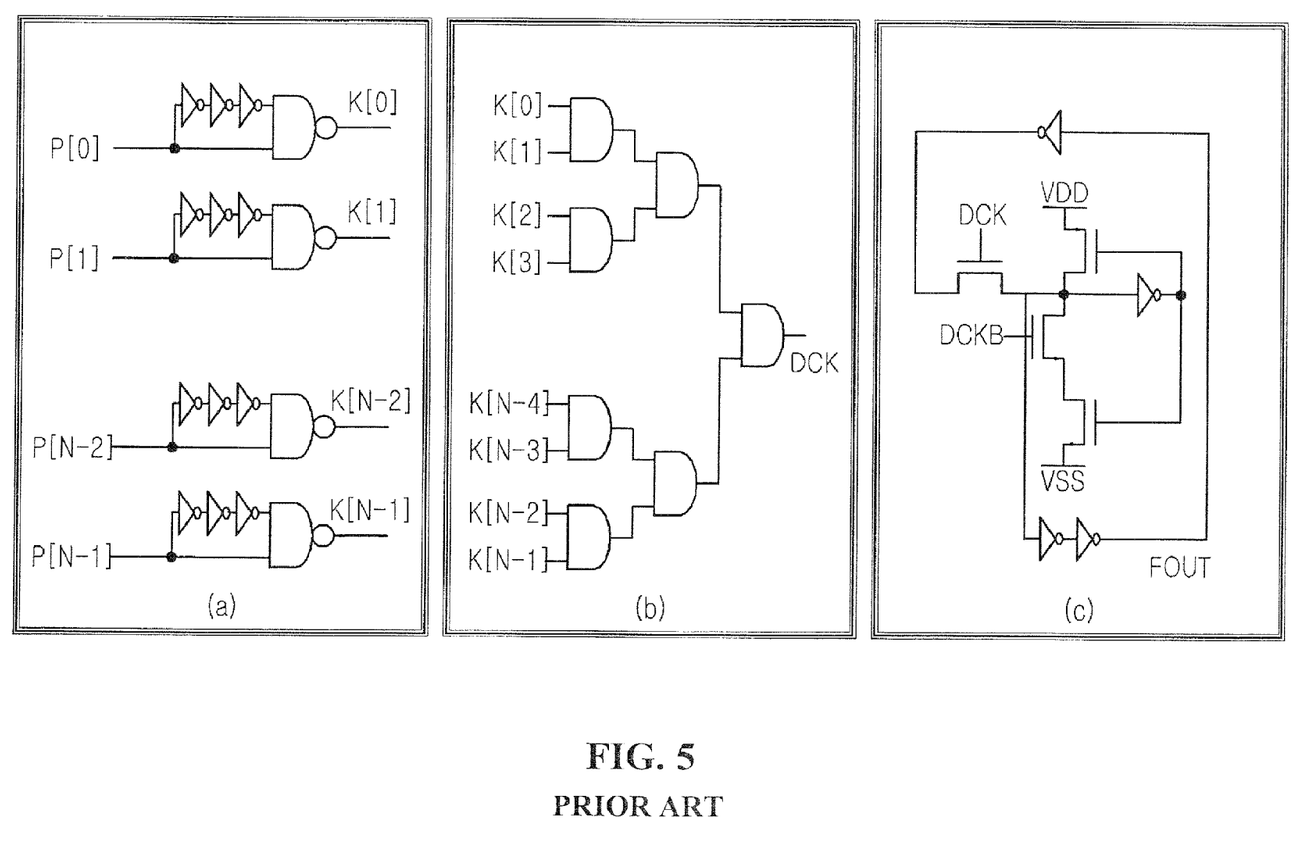
FIG. 5 is a circuit diagram schematically showing components of a frequency multiplier having a feedback structure.
Figure 6:
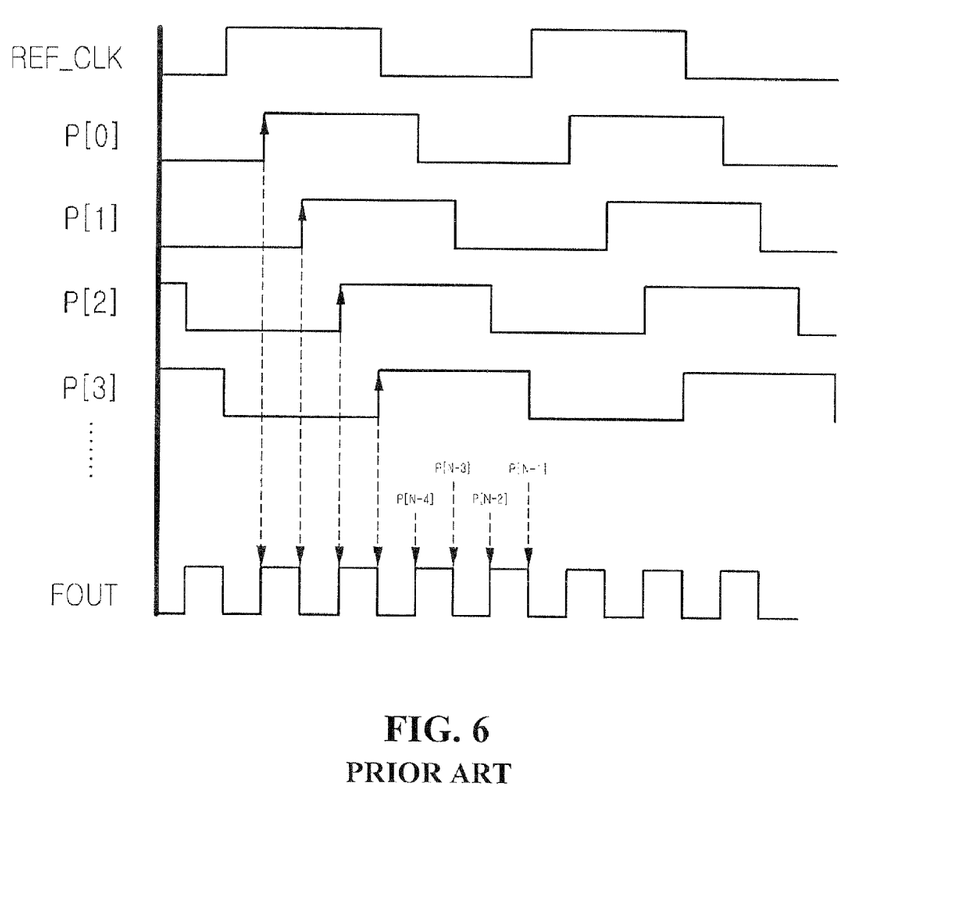
FIG. 6 is a timing diagram showing measured output signals of the frequency multiplier having the feedback structure of FIG. 5.

FIG. 5 is a circuit diagram schematically showing components of a frequency multiplier having a feedback structure, and FIG. 6 is a timing diagram showing measured output signals of the frequency multiplier having the feedback structure.

The frequency multiplier shown in FIG. 5 is a substitute circuit for the frequency multiplier shown in FIG. 3, and includes an edge detector (FIG. 5a), an edge combiner (FIG. 5b), and a toggle pulsed latch (TPL) (FIG. 5c).

When the phase delayed signals P[0], P[1], . . . , P[n−1], P[n] are generated from the DLL, the edge detector detects the rising edge of a phase signal. The edge detector includes a plurality of NAND gates. An input terminal of the NAND gate is connected to a chain structure of inverters to form the feedback structure.

Accordingly, upon the occurrence of a rising edge, a local oscillating operation is instantaneously performed by the chain circuit. The edge combiner (FIG. 5b) combines signals derived from the local oscillating operation to generate a detection signal DCK.

When the detection signal DCK is transferred to the TPL (FIG. 5c), transistors of the TPL (FIG. 5c) selectively operate inverters to alternately provide a 3-inverter chain circuit and a 4-inverter chain circuit.

Accordingly, a clock signal FOUT having a frequency corresponding to "reference clock×the number of phase delayed signals" can be generated.

However, since the number of the phase-delayed signals must be two-squared numbers, there is a limitation to realize frequencies of the clock signal FOUT. In addition, circuits may be complex, and power consumption may be increased.

In particular, in the above feedback structure, since a signal having a noise component is fed back and not removed, an unstable clock signal may be generated.

BRIEF SUMMARY

Embodiments of the present invention can provide a phase clock generator for use in a voltage controlled oscillator (VCO). An embodiment of the present invention provides a phase clock generator capable of generating a clock signal based on a high-frequency characteristic while employing a smaller number of transistors.

According to embodiments, a phase clock generator is provided capable of realizing a clock frequency band without a limitation by freely adding, during design of the phase clock generator, a unit circuit block that multiplies a clock frequency.

According to an embodiment, specific circuits such as an inverter chain circuit, a feedback circuit, a resonance circuit, and a stability circuit can be excluded. Accordingly, a circuit size and an amount of power consumption can be reduced, the design and the manufacturing process of a semiconductor device can be easily performed, a high-frequency clock signal can be generated based on the operational frequency of a transistor, and a phase clock generator, which can minimize the influence of a noise component, can be provided.

According to embodiments, the phase clock generator includes transistors and a buffer. The transistors can be connected between a power line and a grounding line and provided in a form of a 4×N matrix to receive a plurality of phase-delayed signals through their gate terminals. Four transistors can form a unit column, the first two transistors of the unit column can be a pair of NMOS transistors, and the second two transistors can be a pair of PMOS transistors. The buffer is connected to a line, which is provided between the pair of the NMOS transistors and the pair of the PMOS transistors forming the unit column, to transmit a clock signal. According to a further embodiment, by adjusting the ratio of pairs of transistors, the frequency band of the clock signal can be changed. For example, certain ones of the NMOS transistor pairs or PMOS transistor pairs can be removed from the design, creating non-symmetric columns in the matrix that can provide a particular duty ratio.

DETAILED DESCRIPTION

Embodiments of a phase clock generator will be described in detail with reference to accompanying drawings.

Figure 7:
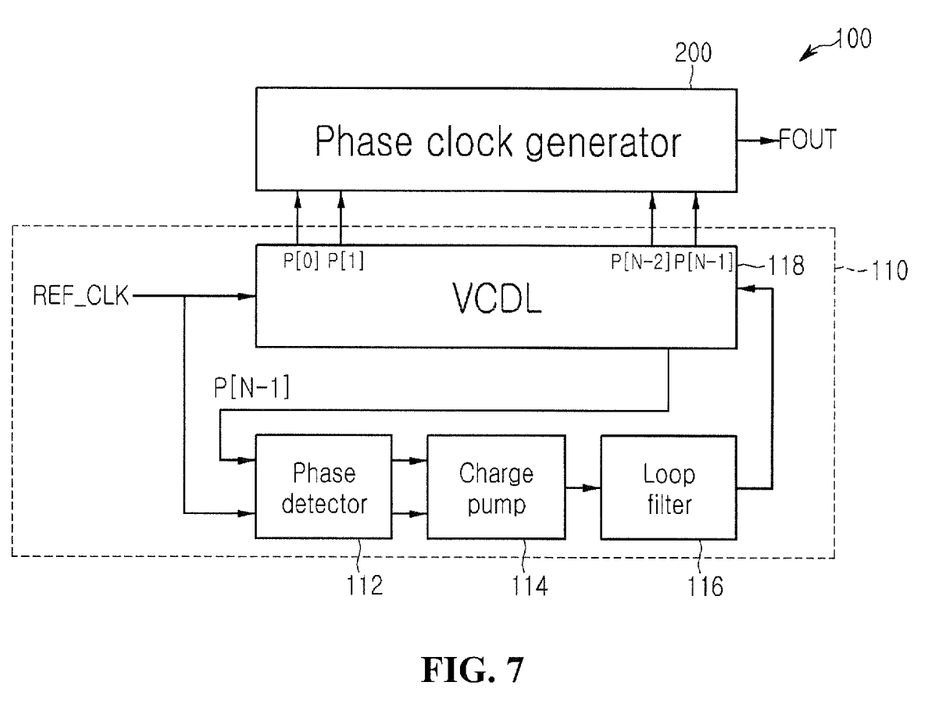
FIG. 7 is a block diagram schematically showing components of a voltage controlled oscillator (VCO) according to an embodiment of the present invention.

FIG. 7 is a block diagram schematically showing components of a voltage controlled oscillator (VCO) 100 according to an embodiment of the present invention.

Referring to FIG. 7, a VCO 100 according to an embodiment can include a delay locked loop 110 and a phase clock generator 200. The DLL 110 can include a phase detector 112, a charge pump 114, a loop filter 116, and a voltage controlled delay line (VCDL) 118.

The VCDL 118 can receive a reference clock (REF_CLK) from an oscillating circuit, and generates a plurality of phase-delayed signals (P[0] to P[N−1]) by phase-delaying the reference clock. The oscillating circuit can be, for example, a temperature controlled X-tal oscillator (TCXO).

The phase detector 112 can sequentially receive the phase-delayed signals from the VCDL 118 and then compares the phase-delayed signals with the reference clock to generate control signals corresponding to a frequency difference between each phase-delayed signal and the reference clock.

The charge pump 114 can regulate a current value according to the control signal from the phase detector 112.

The charge pump 114 either absorbs a specific amount of charges or supplies the charges to the loop filter 116 according to the control signal, so that a control voltage delivered to the VCDL 118 is regulated.

Accordingly, the VCDL 118 can create a plurality of phase-delayed signals having a precise interval.

The VCDL 118 can deliver the phase-delayed signals (P[0], P[1], . . . , P[N−1]) to the phase clock generator 200.

Figure 8:
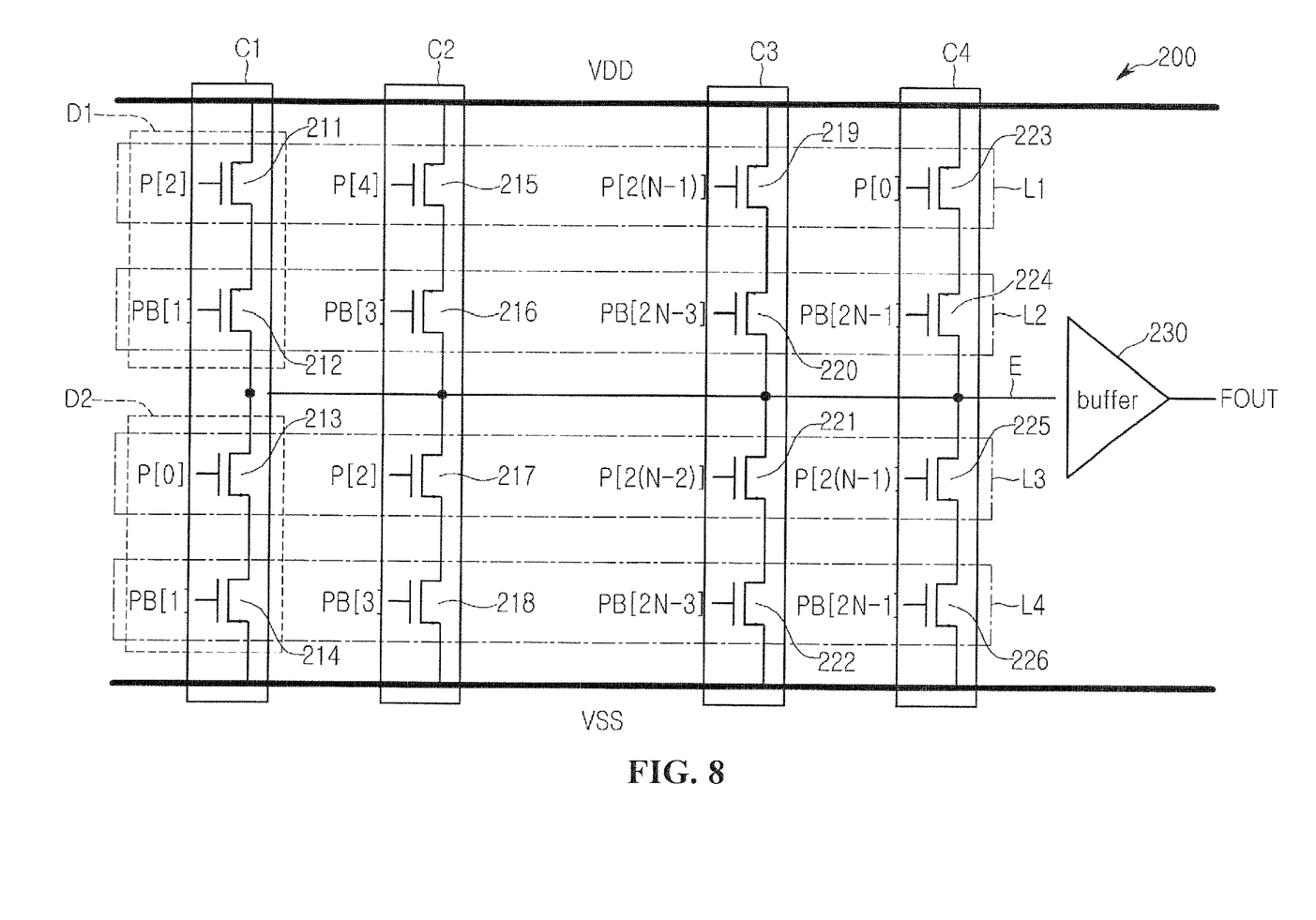
FIG. 8 is a circuit diagram schematically showing components of a phase clock generator according to a first embodiment of the present invention.
Figure 9:
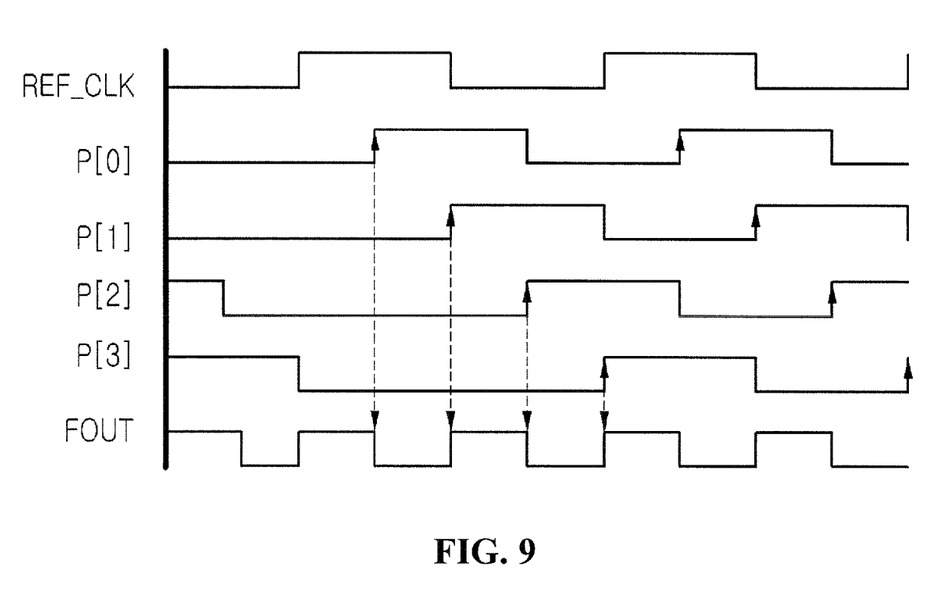
FIG. 9 is a time chart showing measured output signals of the phase clock generator according to the first embodiment.

FIG. 8 is a circuit diagram schematically showing components of a phase clock generator 200 according to a first embodiment, and FIG. 9 is a time chart showing measured output signals of the phase clock generator 200 according to the first embodiment.

Referring to FIG. 8, the phase clock generator 200 according to the first embodiment includes a plurality of transistors connected to each other in the form of a matrix between a power line VDD and a grounding line VSS. A buffer 230 can be connected to a line attached to certain nodes of the matrix of transistors. The matrix can take the form of four rows and N columns.

According to one embodiment as shown in FIG. 8, the transistors 211 to 226 can be arranged in four rows L1 to L4 and N columns C1 to C4, each row includes N transistors, and each column includes four transistors.

The four transistors provided in each column (e.g., the first column C1) are arranged in pairs. In other words, with reference to the first column C1, the two transistors 211 and 212 provided at the upper portion of the column C1 form a pair D1, and the two transistors 213 and 214 provided at the lower portion of the column C1 form a pair D2. A node between the paired transistors can be connected to a central line E.

The central line E can be connected to the buffer 230, and an output signal FOUT can be transmitted through the buffer 230.

Hereinafter, for the purpose of explanation, the pair of two transistors 211 and 212 provided at the upper portion of the column C1 is referred to as "first pair D1", and the pair of two transistors 213 and 214 provided at the lower portion of the column C1 is referred to "second pair D2".

The transistors (211, 212, 215, 216, 219, 220, 223, and 224) positioned as first pairs D1 can be p-channel metal-oxide semiconductor (PMOS) transistors.

The transistors (213, 214, 217, 218, 221, 222, 225, and 226) positioned as second pairs D2 can be n-channel metal-oxide semiconductor (NMOS) transistors.

When a low voltage is applied to the gates of the transistors forming the first pairs D1, the transistors are turned on to output a high-potential signal. In contrast, when a high voltage is applied to the gates of the transistors, the transistors forming the first pairs D1 are turned off such that a low-potential signal may be output using the transistors forming the second pairs D2.

When a high voltage is applied to gates of the transistors forming the second pairs D2, the transistors are turned on to output a low-potential signal. In contrast, when a low voltage is applied to the gates of the transistors forming the second pairs D2, the transistors are turned off such that a high-potential signal may be output using the transistors forming the first pairs D2.

The transistors forming the matrix as described above combine the phase-delayed signals delivered from the VCDL 118 to generate the clock signal.

The first pair D1 of the transistors and the second pair D2 of the transistors forming the columns C1 to C4 can generate the clock signal in a symmetric structure. The first pair D1 and the second pair D2 of transistors arranged in this symmetrical manner can perform frequency division with a duty ratio of 50 to 50. The columns of the first pair D1 and the second pair D2 of transistors determine rising and falling periods of the clock signal FOUT by combining the rising edges of the phase-delayed signals.

Signals combined in the columns C1 to C4 can be delivered to the buffer 230 through the central line E, and the buffer 230 sequentially transmits the combined signals to generate a clock signal having a high frequency corresponding to "½× N×reference clock".

Accordingly, the columns of the transistors are provided as an even number, that is, "N" is an even number.

The structure and operation of the transistors will be described with reference to the following table. The rows and columns indicate an available slot for a transistor in the matrix where first row and second row transistors are PMOS transistors and third row and fourth row transistors are NMOS transistors.

TABLE 1

| row | | 1st column | 2nd column | ... | $(N-1)^{th}$ column | $N^{th}$ column |
|---|---|---|---|---|---|---|
| 1st row | Phase signal select equation | $P[2(n-1)]$ | | | | |
| | Variable n | n = 2 | n = 3 | ... | n = N | n = 1 |
| | Phase-delayed signal | P[2] | P[4] | ... | P[2(N−1)] | P[0] |
| 2nd row | Phase signal select equation | | | | PB[2n−1] | |
| | Variable n | n = 1 | n = 2 | ... | n = N−1 | n = N |
| | Phase-delayed signal | PB[1] | PB[3] | ... | PB[2N−3] | PB[2N−1] |
| 3rd row | Phase signal select equation | | | | P[2(n−1)] | |
| | Variable n | n = 1 | n = 2 | ... | n = N−1 | n = N |
| | Phase-delayed signal | P[0] | P[2] | ... | P[2(N−2)] | P[2(N−1)] |
| 4th row | Phase signal select equation | | | | PB[2n−1] | |
| | Variable n | n = 1 | n = 2 | ... | n = N−1 | n = N |
| | Phase-delayed signal | PB[1] | PB[3] | ... | PB[2N−3] | PB[2N−1] |

Referring to Table 1, the phase signal select equation, P[f (x)], is an equation to select phase-delayed signals, which are applied to the gates of the transistors provided in the rows and columns. The phase select equation, PB[f(x)], is phase-inverted by 180 degrees with respect to the phase signal select equation, P[f(x)].

The first to $N^{th}$ columns repeatedly form one loop to continuously generate clock signals. In the second, third, and fourth rows, "n=1, 2, . . . , N−1, N" are sequentially applied to the corresponding phase select equations to form a loop.

However, in the first row, the loop for the first row begins with n=2 such that after "n=2, . . . , N−1, N" are sequentially applied to the phase select equation, "n=1" is finally applied to the phase select equation to form the loop.

Further, it can be recognized from table 1 that the phase signal select equation of the first row is the same as the phase signal select equation of the third row, and the phase signal select equation of the second row is the same as the phase signal select equation of the fourth row. This represents that the phase signal selection equations applied to transistors are also paired.

Different phase-delayed signals can be applied to the gates of the transistors provided at the rows and the columns as described above, and the PMOS transistors forming the first pair D1 and the NMOS transistors forming the second pair D2 can be operated, such that rising edges of the phase-delayed signals can be detected with a predetermined time interval.

In addition, as the rising edges are detected, rising and falling periods of a clock signal are determined. The signals combined through the rows C1 to C4 are delivered to the buffer 230 through the central line E.

Then, the buffer 230 sequentially transmits the combined signals to oscillate a clock signal having a high frequency corresponding to "½×N×reference clock".

As described above, a phase clock generator can be constructed through the transition of phase-delayed signals instead of a conventional LC tank resonance circuit, a conventional inverter chain circuit, a conventional feed back loop circuit, or a conventional stability circuit structure.

Accordingly, a high-frequency clock signal can be generated based on the operational frequency of a transistor. In addition, a clock signal can be inhibited from having an unstable state due to the feedback of a noise component.

According to embodiments, since a circuit can be constructed by using only a minimum of transistors, the size of the circuit can be reduced, so that a lower-power circuit can be realized.

Figure 10:
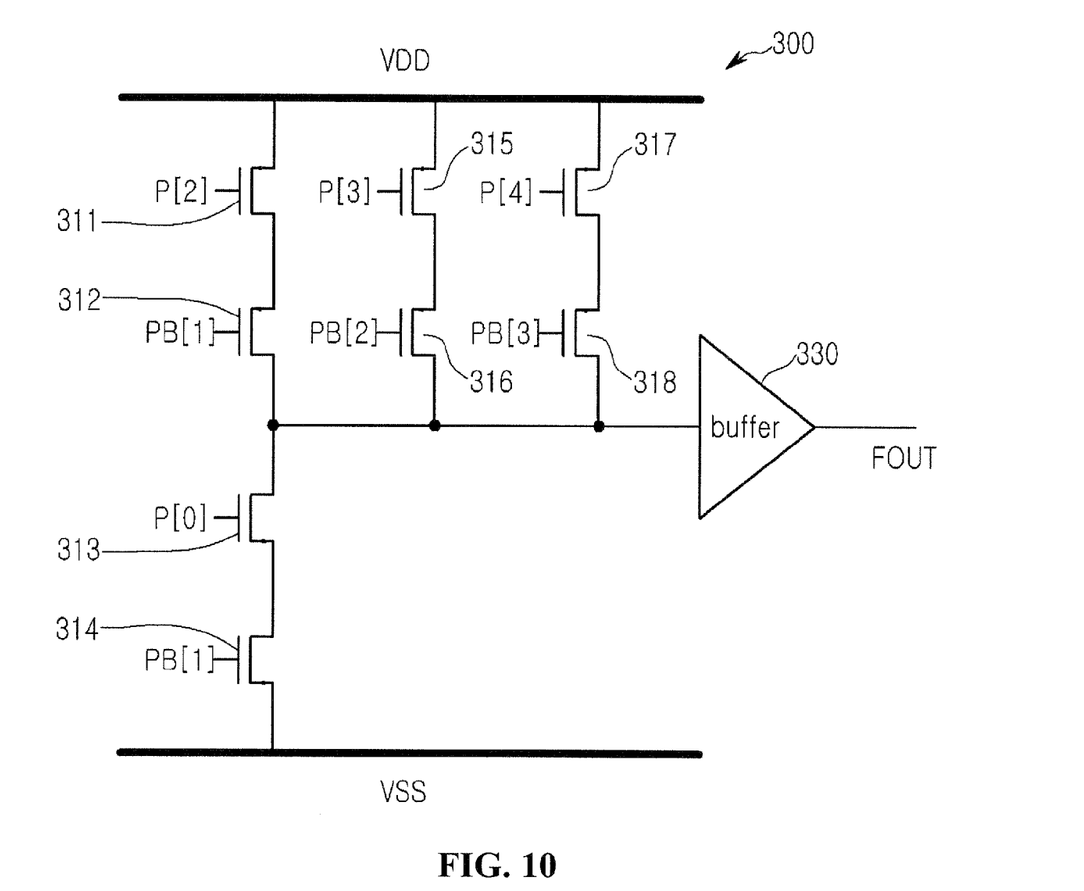
FIG. 10 is a circuit diagram schematically showing components of a phase clock generator according to a second embodiment of the present invention.
Figure 11:
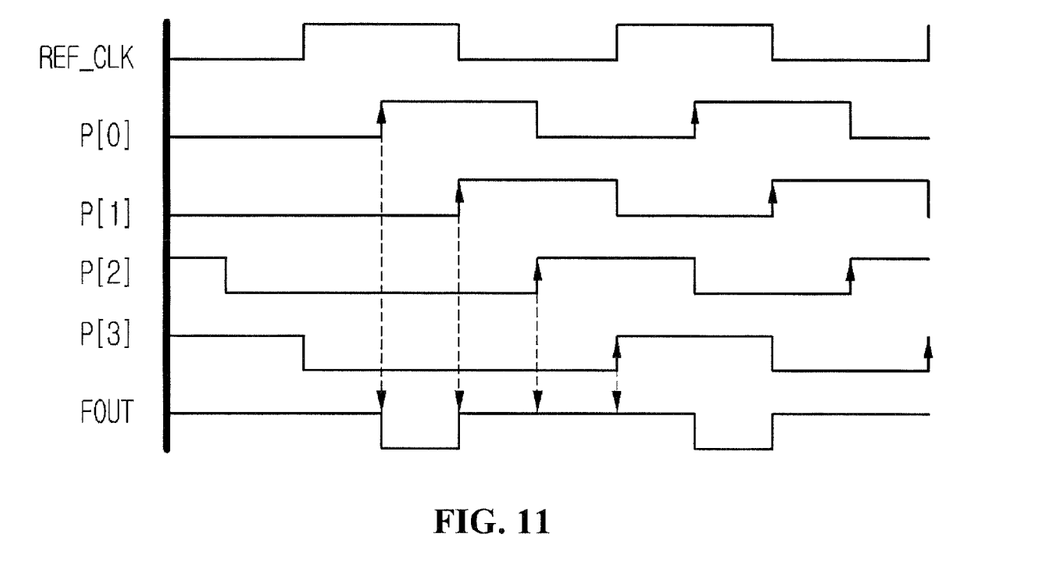
FIG. 11 is a timing chart showing measured output signals of the phase clock generator according to the second embodiment.

FIG. 10 is a circuit diagram schematically showing components of a phase clock generator 300 according to a second embodiment, and FIG. 11 is a timing chart showing measured output signals of the phase clock generator 300 according to the second embodiment.

The phase clock generator 300 according to the second embodiment shown in FIG. 10 can be connected to the VCDL 118 as shown in FIG. 7. The phase clock generator 300 can have a circuit structure and an operational characteristic similar to those of the phase clock generator according to the first embodiment, and certain similar details thereof will be omitted in order to avoid redundancy.

In the phase clock generator 200 according to the first embodiment, the first pair D1 of transistors and the second pair D2 of transistors forming the columns C1 to C4 are symmetric to each other, and perform a frequency division function with a duty ratio of 50 to 50. In contrast, the phase clock generator 300 according to the second embodiment allows a frequency division function with a different duty ratio. In particular, the arrangement illustrated in FIG. 10 provides a duty ratio of 25 to 75, which is illustrated in FIG. 11.

Thus, by adjusting the ratio of pairs of transistors, a frequency band of a clock signal can be changed.

In other words, according to embodiments, the ratio of the pairs of transistors and the number (even number) of the columns of the transistors can be adjusted, thereby adjusting the frequency band of a clock signal which is finally oscillated.

The effects of certain embodiments of the present invention are as follows.

First, since the feedback structure of an inverter chain circuit is not used, a high-frequency clock signal can be generated based on the operational frequency of a transistor. Therefore, the clock signal can be inhibited from having an unstable state due to the feedback of a noise component.

Second, since additional circuits such as distributed elements (e.g., an inductor) and a stability circuit are not required, the size of a circuit can be reduced, and the circuit can be simplified. In addition, since the number of transistors used in the phase clock generator can be greatly reduced, a micro integration circuit can be realized, and a low-power consumption circuit can be realized.

Third, by provided a simplified circuit, a semiconductor device can be easily designed and manufactured. Accordingly, the manufacturing cost can be reduced, and product efficiency can be improved.

Fourth, problems associated with degradation of the high-frequency characteristics of a clock signal due to an inverter circuit can be avoided. In addition, since a unit circuit, such as additional columns in the matrix shown in FIG. 8, can be freely added and designed, a frequency band can be realized without limitation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phase clock generator comprising:
   Transistors arranged in a 4×N matrix, where N is a number of columns, wherein transistors of a first row and a second row of the 4×N matrix are arranged as PMOS transistor pairs, wherein transistors of a third row and a fourth row of the 4×N matrix are arranged as NMOS transistor pairs, wherein the transistors of the 4×N matrix receive a plurality of phase-delayed signals through respective gate terminals, wherein first row transistors connect to a power line and fourth row transistors connect to a ground line; and
   a buffer connected to a line that is connected to a drain node of second row transistors and third row transistors, wherein the buffer transmits a clock signal,
   wherein the gate terminals of the transistors forming "first row×each column" receive different types of phase-delayed signals based on an equation P[2(n−1)], where n is a positive integer, wherein a first column receives the phase-delayed signal initially where n=2, and each consecutive column to an $N^{th}$ column receives the phase delayed signal beginning at n=3 and consecutively increasing to n=N before looping back to n=1.

2. The phase clock generator according to claim 1, wherein the transistors receive the plurality of phase-delayed signals from a voltage controlled delay line (VCDL).

3. The phase clock generator according to claim 1, wherein the "n" is repeatedly input to the equation in a form of a loop while maintaining an input value sequence.

4. The phase clock generator according to claim 1, wherein each column comprises one PMOS transistor pair and one NMOS transistor pair, wherein the four transistors of each column are arranged such that a source of a first PMOS transistor is connected to a power line, a source of a second PMOS transistor is connected to a drain of the first PMOS transistor, a drain of a first NMOS transistor is connected to a drain of the second PMOS transistor, a drain of a second NMOS transistor is connected to a source of the first NMOS transistor and a source of the second NMOS transistor is connected to the ground line.

5. A phase clock generator comprising;
   Transistors arranged in a 4×N matrix, where N is a number of columns, wherein transistors of a first row and a second row of the 4×N matrix are arranged as PMOS transistor pairs, wherein transistors of a third row and a fourth row of the 4×N matrix are arranged as NMOS transistor pairs, wherein the transistors of the 4×N matrix receive a plurality of phase-delayed signals through respective gate terminals, wherein first row transistors connect to a power line and fourth row transistors connect to a ground line; and
   a buffer connected to a line that is connected to a drain node of second row transistors and third row transistors, wherein the buffer transmits a clock signal,
   wherein the gate terminals of the transistors forming "second row×each column" receive different types of phase-delayed signals phase-inverted by 180 degrees based on an equation PB[2n−1], where n is a positive integer, wherein initially a first column receives the phase-delayed signal phase-inverted by the 180 degrees where n=1, and each consecutive column to the Nth column receives the phase-delayed signal phase-inverted by the 180 degrees beginning at n=2 and consecutively increasing to n=N.

6. The phase clock generator according to claim 5, wherein the "n" is repeatedly input to the equation in a form of a loop while maintaining an input value sequence.

7. A phase clock generator comprising:
   Transistors arranged in a 4×N matrix, where N is a number of columns, wherein transistors of a first row and a second row of the 4×N matrix are arranged as PMOS transistor pairs, wherein transistors of a third row and a fourth row of the 4×N matrix are arranged as NMOS transistor pairs, wherein the transistors of the 4×N matrix receive a plurality of phase-delayed signals through respective gate terminals, wherein first row transistors connect to a power line and fourth row transistors connect to a ground line; and
   a buffer connected to a line that is connected to a drain node of second row transistors and third row transistors, wherein the buffer transmits a clock signal,
   wherein the gate terminals of the transistors forming "third row×each column" receive different types of phase-delayed signals based on an equation P[2(n−1)], where n is a positive integer, wherein initially a first column receives the phase-delayed signal where n=1, and each consecutive column to the Nth column receives the phase-delayed signal beginning at n=2 and consecutively increasing to n=N.

8. The phase clock generator according to claim 7, wherein the "n" is repeatedly input to the equation in a form of a loop while maintaining an input value sequence.

9. A phase clock generator comprising:

Transistors arranged in a 4×N matrix, where N is a number of columns, wherein transistors of a first row and a second row of the 4×N matrix are arranged as PMOS transistor pairs, wherein transistors of a third row and a fourth row of the 4×N matrix are arranged as NMOS transistor pairs, wherein the transistors of the 4×N matrix receive a plurality of phase-delayed signals through respective gate terminals, wherein first row transistors connect to a power line and fourth row transistors connect to a ground line; and a buffer connected to a line that is connected to a drain ode of second row transistors and third row transistors, wherein the buffer transmits a clock signal, wherein the gate terminals of the transistors forming "fourth row×each column" receive different types of phase-delayed signals phase-inverted by 180 degrees based on an equation PB[2n−1], where n is a positive integer, wherein initially a first column receives the phase-delayed signal phase-inverted by the 180 degrees where n=1, and each consecutive column to the Nth column receives the phase-delayed signal phase-inverted by the 180 degrees beginning at n=2 and consecutively increasing to n=N.

10. The phase clock generator according to claim 9, wherein the "n" is repeatedly input to the equation in a form of a loop while maintaining an input value sequence.

* * * * *